Sept. 10, 1957 J. L. BOYER ET AL 2,806,187

SEMICONDUCTOR RECTIFIER DEVICE

Filed Nov. 8, 1955 3 Sheets-Sheet 1

WITNESSES

Edwin E. Bassler

Wm. C. Groome

INVENTORS
John L. Boyer &
Willard S. Albert
BY F. P. Lyle
ATTORNEY

Sept. 10, 1957 J. L. BOYER ET AL 2,806,187

SEMICONDUCTOR RECTIFIER DEVICE

Filed Nov. 8, 1955 3 Sheets-Sheet 2

1

2,806,187

SEMICONDUCTOR RECTIFIER DEVICE

John L. Boyer, Pittsburgh, and Willard S. Albert, Penn Township, Westmoreland County, Pa., assignors to Westinghouse Electric Corporation, East Pittsburgh, Pa., a corporation of Pennsylvania Application November 8, 1955, Serial No. 545,669

9 Claims. (Cl. 317—234)

The present invention relates to semiconductor rectifiers, and more particularly to an air-cooled power rectifier assembly.

The invention provides an air-cooled assembly for semiconductor rectifier devices of the P-N junction type, such as silicon rectifiers, although any type of semiconductor device may be utilized in this assembly.

Semiconductor materials, such as silicon and germanium, may exist in either of two conductivity types, depending upon the treatment of the material and the presence of extremely small amounts of certain impurities. N-type material is characterized by an excess of electrons and its conductivity is due to the presence of these electrons. P-type material is characterized by a deficiency of electrons in the crystal structure of the material, resulting in so-called holes, and the conductivity of the material is due to an apparent movement of these holes which act like positive charges. If a body of semiconductor material has adjoining zones of N-type and P-type material, the junction between the two zones acts as a rectifying barrier or layer, since it permits current to flow freely from the P-type material to the N-type material, but presents a very high impedance to current flow from the N-type to the P-type material so that only an extremely small leakage current can flow.

These P–N junction rectifiers have very desirable characteristics since they are capable of withstanding relatively high reverse voltages and can carry currents of high current density in the forward direction with good efficiency. These devices, therefore, are very suitable for use as power rectifiers, and can handle relatively large amounts of power if the rectifying junction is made of sufficient area. In order to obtain high current ratings, however, it is necessary to provide very effective cooling, since semiconductor materials have rather definite temperature limits which must not be exceeded. If the temperature of the material becomes too high, its reverse impedance is rapidly reduced, resulting in large leakage currents which cause further heating, with damage to the rectifier. A practical rectifier construction, therefore, must provide adequate cooling in order to obtain high current ratings, and it is also necessary to seal or encapsulate the rectifier to protect it against moisture, and other impurities, which have a very adverse effect on the characteristics and life of the rectifier.

These semiconductor rectifier devices are suitable for use for many different purposes requiring different circuit configurations and different physical arrangements. The construction of a rectifier device or assembly, therefore, should be such that it is capable of use in many different arrangements and circuit connections, so that a single standard device can be used for different applications without requiring a special design to be made for each application. It is also desirable for such an assembly to use a minimum number of parts and to use interchangeable components which can be used in different assemblies, for economy of manufacture, thus making it

2 possible to provide a small number of standard rectifier assemblies of suitable ratings which can be used either singly or in stacked groups for many different applications.

The principal object of the present invention is to provide an air-cooled semiconductor rectifier assembly which provides effective cooling and which is very versatile in application.

Another object of the invention is to provide a semiconductor rectifier device which is effectively encapsulated for protection against moisture, and which is mounted in a finned structure of relatively simple construction which provides very effective cooling.

A further object of the invention is to provide a semiconductor rectifier assembly having a finned structure for supporting an encapsulated rectifier device, which uses a minimum number of parts which are easily produced and which can be used interchangeably in rectifier assemblies of different ratings, and which is capable of use in various circuit configurations and physical arrangements so as to be very versatile in application.

Other objects and advantages of the invention will be apparent from the following detailed description, taken in connection with the accompanying drawings, in which.

Figure 1:
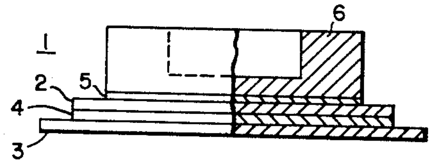
Figure 1 is a view on a greatly enlarged scale of a semiconductor rectifier cell.
Figure 2:
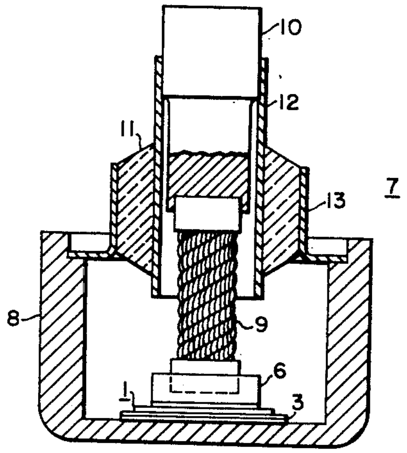
Figure 2 is a sectional view of an encapsulated rectifier device.
Figure 3:
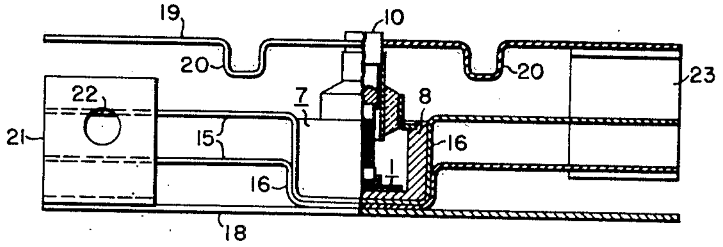
Fig. 3 is a view, partly in elevation and partly in vertical section, of a rectifier assembly embodying the invention.
Figure 4:
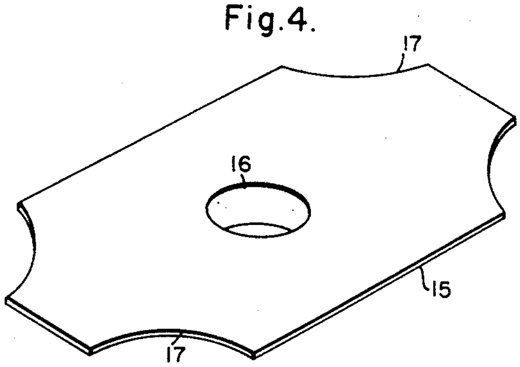
Fig. 4 is a perspective view of a fin member.

Any suitable type of rectifier device may be used in the assembly of the present invention, a preferred construction being shown in Figs. 1 and 2. The rectifier cell itself may be of any suitable type, a typical cell being shown in Fig. 1, in which the thicknesses of the various elements of the cell are greatly exaggerated for clarity of illustration. The rectifier cell 1 shown in this figure includes a semiconductor body 2, which is preferably silicon and which is in the form of a thin wafer cut from a single crystal, the area of the wafer being large enough to give the desired current carrying ability and the thickness being as small as possible to keep the forward voltage drop low. The semiconductor 2 is preferably N-type material and is mounted on a bottom support plate 3 with an ohmic contact by means of a suitable solder 4, which is preferably a silver alloy when the semiconductor is silicon. The support plate 3 is preferably made of molybdenum or tungsten since these materials have good thermal conductivity and have coefficients of thermal expansion close to those of silicon and germanium, so that the fragile semiconductor is not subjected to stresses due to differential expansion when the cell is heated during manufacture or in service.

A thin layer of an acceptor material 5, which is preferably aluminum, is placed on the silicon crystal 2 and when the device is heated to the proper temperature during manufacture, the aluminum alloys with the silicon and diffuses into it to convert a portion of the semiconductor to P-type, forming a rectifying junction. An upper support or terminal member 6, preferably also made of molybdenum or tungsten, is placed on the upper surface of the rectifier cell and bonded to it by the aluminum. In the illustrated embodiment, the upper support member 6 is made in the form of a cup-shaped member, as shown in the drawings, to facilitate the attachment of a conductor thereto, although any suitable shape could be used. Silicon is the preferred semiconductor material for use in the assembly described herein, because it is capable of operation at relatively high temperature, as compared to other semiconductors, so that high current ratings can be obtained with air cooling. It will be understood, however, that other semiconductors, such as germanium, might be used and that any suitable solder and acceptor material could be used. Thus, if the semiconductor is germanium, pure tin is preferably used for soldering it to the lower support plate and indium would be the preferred acceptor material.

As previously mentioned, it is necessary to effectively seal or encapsulate the rectifier cell 1 for protection against moisture and other impurities. A desirable construction for this purpose is shown in Fig. 2. The rectifier device 7 shown in Fig. 2 comprises a generally cup-shaped container 8, which is preferably made of copper and which may have relatively thick walls so as to have high thermal capacity. The rectifier cell 1 is disposed within the container 8 and the bottom support plate 3 of the rectifier cell is soldered or otherwise attached to the bottom surface of the container to be connected thereto with a joint of good thermal and electrical conductivity. A flexible conductor 9, which is shown as a multi-strand copper cable capable of carrying heavy currents, is attached to the upper side of the rectifier cell, preferably by soldering in the cup-shaped upper support member 6. A substantially rigid terminal member 10, which may be made from a copper rod, is soldered or otherwise attached to the upper end of the flexible conductor 9.

The device is closed and sealed by means of a glass bushing 11 with inner and outer sleeves 12 and 13 fused to the glass. The sleeves 12 and 13 are preferably made of an alloy capable of forming a permanent air-tight seal with glass, such as the iron-nickel-cobalt alloy known as Kovar, and are soldered or brazed to the terminal member 10 and to the container 8, respectively, to hermetically seal the container, the glass bushing 11 insulating the terminal 10 from the container 8. The container 8 is preferably evacuated before final sealing and may be filled with dry air or a dry inert gas such as argon or helium.

Thus, a relatively simple structure is provided which effectively protects the rectifier cell against moisture or other impurities by completely enclosing it in a sealed container, and which provides for very effective heat transfer from the rectifier cell because it is in good thermal relation with the relatively large copper mass of the container 8. The flexible conductor 9 protects the fragile semiconductor material against any substantial mechanical stresses which might be imposed on it by handling of the device or by thermal expansion.

The rectifier device 7 is mounted and supported in a finned structure shown in Figs. 3 through 6. This structure includes one or more intermediate fin members 15, preferably made of either copper or aluminum to have good thermal conductivity, so as to effectively dissipate heat from the rectifier device 7. These fin members may be generally rectangular and each fin member has a central depression or recess 16 of suitable size to receive the rectifier device 7. The corners of the fin members 15 are preferably cut off or clipped as indicated at 17 in Fig. 4. If two or more fin members are used, as shown in the drawings, their depressions 16 are nested and the fin members are secured together by brazing or soldering. A lower fin member 18 which may also be generally rectangular, is soldered or brazed to the bottom of the depression 16 of the lowermost intermediate fin 15. The rectifier device 7 is placed in the depression 16 of the uppermost intermediate fin 15, and the copper container 8 is brazed or soldered to the fin to be in good thermally and electrically conductive relation to the fins 15 and 18. An upper fin member 19 which may also be generally rectangular and of the same size as the lower fin 18 is also provided. The upper fin 19 has a central opening which fits on the terminal member 10 of the rectifier device 7, so that the fin 19 may be attached to the rectifier device either by a tight press fit or by soldering. The fin 19 has transverse ridges or depressions 20 formed in it extending entirely across the fin to give it lateral flexibility, so that little or no mechanical force is transmitted to the bushing 11 by the fin.

Two terminal members or connectors 21 are attached to the lower fin 18 at opposite ends thereof. These connectors may be copper strap members, as shown in the drawings, soldered or otherwise attached to the fin and provided with openings 22 for attachment of leads or buses. A similar terminal member 23 is attached to the upper fin 19 at one end on the opposite side of the assembly from the terminal members 21. It has been found that the use of three terminal members as described makes it possible to connect the rectifier in many different circuit configurations with simple electrical connections, and thus the use of these terminal members contributes to the versatility of the assembly by making it possible to connect it easily in any desired circuit arrangement.

Figure 5:
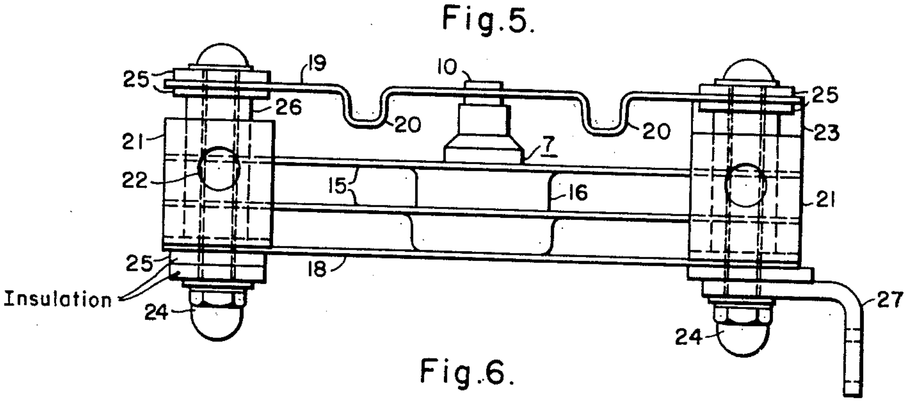
Fig. 5 is a view in elevation of a complete rectifier assembly.
Figure 6:
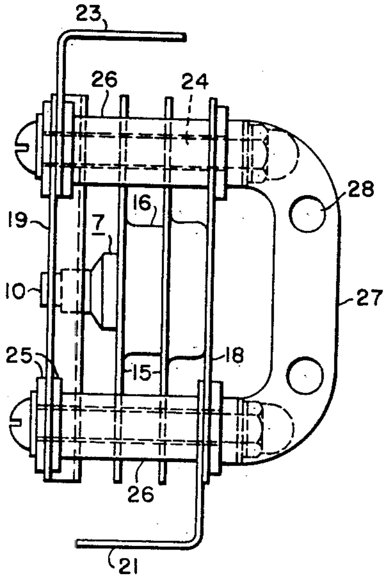
Fig. 6 is an end view of the assembly of Fig. 5.

The completed rectifier assembly is shown in Figs. 5 and 6. As shown in these figures, the upper and lower fins 18 and 19 are substantially rigidly connected mechanically by insulated tie bolts 24, which extend through mounting holes in the corners of the fins 18 and 19 and which are insulated in any suitable manner to insulate the fins from each other, which is necessary because the fins 18 and 19 are electrically connected to opposite sides of the rectifier cell. Insulating washers 25 are provided on opposite sides of the fins 18 and 19, and tubular spacers 26 are preferably placed on the bolts 24 between the upper and lower fins to space them a definite predetermined distance apart. The corners of the intermediate fins 15 are cut off at 17, as previously mentioned, in order to clear the spacers 26, thus making it unnecessary to line up a number of mounting holes in the assembly of the device and making it possible to use spacers 26 of any desired type or size without affecting the ease and simplicity of assembly.

It will be seen that the entire structure is rigidly clamped together but with the opposite sides of the rectifier cell effectively insulated from each other. The structure is relatively simple and consists of simple components which can easily be produced and assembled. The tie bolts 24 may be placed at all four corners of the assembly, if desired, but it has been found that in most cases only three such bolts are necessary, as the structure is sufficiently rigid, and it is therefore preferred to use only three bolts 24, although in some cases it may be possible to obtain sufficient rigidity with only two bolts at diagonally opposite corners. The transverse ridges 20 in the upper fin 19 provide sufficient lateral flexibility to permit differences in thermal expansion between the upper and lower fins 18 and 19. It will be understood that in operation of the rectifier, the upper and lower fins may become heated to different temperatures, and since their outer corners are rigidly connected together, the resulting difference in expansion might cause damage. By providing the ridges 20, however, which provide lateral flexibility in the upper fin 19, this difficulty is avoided and the fins 18 and 19 can expand by different amounts without damaging the structure, and without imposing any substantial stresses on the bushing 11 or on the seals of the rectifier device.

The assembly may be mounted by means of a mounting bracket 27 supported on the tie bolts 24 at one end of the assembly, as shown in Figs. 5 and 6. The mounting bracket 27 may be a generally U-shaped member, as shown, with portions extending laterally for engagement by the bolts 24, and may be provided with mounting holes 28. It will be apparent that the mounting bracket 27 may be attached to either end of the assembly and on either the top or bottom or, if desired, a mounting bracket of greater length could be provided and attached on the long side of the assembly on either side thereof and on either the top or bottom fin. Thus, by suitably positioning either of two sizes of mounting brackets, eight different mounting positions are possible, so that the device can be used in a large number of different physical arrangements.

The fins 15, 18 and 19 are of relatively large area and are in good heat transfer relation to the rectifier cell 1, so that very effective dissipation of heat is obtained and high current ratings are possible, especially if the rectifier cell 1 is a silicon rectifier which can safely be operated at temperatures as high as 200° C. The fins 15, 18 and 19 may be made of any suitable material, copper or aluminum being preferred. If copper is used, the fins should preferably be protected from oxidation which may occur at the relatively high operating temperature. This may be done by nickel plating the assembly, or by coating the fins with a high temperature paint such as a silicone base paint, or in any other desired manner. Two intermediate fins 15 have been shown in the drawings, but in some cases where the current rating is lower only one intermediate fin may be required and the lowermost intermediate fin may be omitted.

The rectifier assembly described above is a relatively simple structure which can easily be assembled from standardized parts which are usable in assemblies of different current ratings. This structure is very versatile in application since it is capable of being mounted in various different positions, as required for different applications, and it can readily be connected in many different circuit configurations with simple electrical connections.

Figure 7:
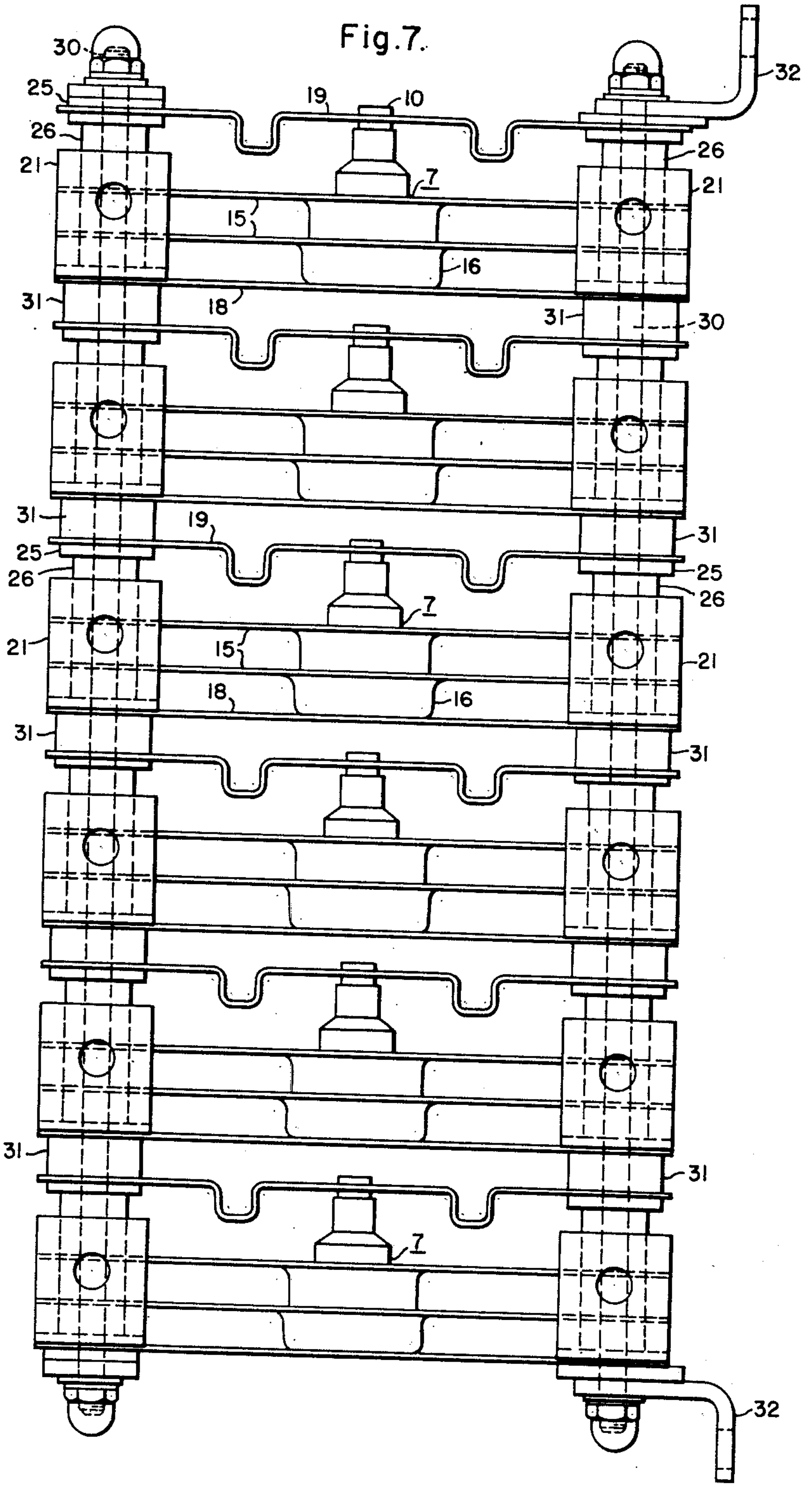
Fig. 7 is a view in elevation of a stacked group of rectifier assemblies.

This assembly is also capable of use in multiple-unit stacked assemblies such as the six-unit assembly shown in Fig. 7. When utilized in this manner, the desired number of individual assemblies of the type described above are stacked one above the other, and the individual bolts 24 are replaced by tie rods 30 which extend through the entire stack as shown in Fig. 7. The tie rods 30 are insulated in the same manner as the bolts 24 previously described, and the individual rectifier assemblies are separated and insulated from each other by insulating spacers 31 placed on the tie rods 30 between the individual assemblies. The rectifier assemblies shown in Fig. 7 are otherwise the same as described above. The stacked assembly of Fig. 7 may be mounted by mounting brackets 32 at top and bottom supported on the tie rods 30. The mounting brackets 32 may be similar to the brackets 27 previously described and may be placed on either side of the stack. Mounting brackets of suitable size might also be placed on the long side of the assembly in the manner previously described, so that four different mounting positions are possible. The arrangement of the terminal members 21 and 23 make it possible to connect the units in a multiple-unit stack such as that of Fig. 7 in any desired circuit arrangement in a very simple manner.

It should now be apparent that a semiconductor rectifier assembly has been provided which is very versatile in application, since it is suitable for mounting in numerous different physical arrangements and can readily be connected in various circuit configurations. Thus, a single standardized rectifier assembly is provided which is capable of use in many different applications. The structure itself is relatively simple and is easily assembled from a minimum number of standardized parts, thus providing great economy in manufacture. A specific embodiment of the invention has been shown and described for the purpose of illustration, but it will be understood that various other embodiments and modifications are possible and are within the scope of the invention.

We claim as our invention:

1. A rectifier assembly comprising a lower fin member, an intermediate fin member, said intermediate fin member having a generally cup-shaped depression therein and being attached to the lower fin member, a semiconductor rectifier device disposed in said depression and conductively attached to the intermediate fin member, said rectifier device having an upper terminal member, an upper fin member mounted on said terminal member, means for rigidly connecting together the upper and lower fin members and for insulating them from each other, and terminal means on the upper and lower fin members.

2. A rectifier assembly comprising a lower fin member, an intermediate fin member, said intermediate fin member having a generally cup-shaped depression therein and being attached to the lower fin member, a semiconductor rectifier device disposed in said depression and conductively attached to the intermediate fin member, said rectifier device having an upper terminal member, an upper fin member mounted on said terminal member, said upper fin member having transverse ridges therein to provide flexibility, means for rigidly connecting together the upper and lower fin members and for insulating them from each other, and terminal means on the upper and lower fin members.

3. A rectifier assembly comprising a lower fin member, an intermediate fin member, said intermediate fin member having a generally cup-shaped depression therein and being attached to the lower fin member, a semiconductor rectifier device disposed in said depression and conductively attached to the intermediate fin member, said rectifier device having an upper terminal member, an upper fin member mounted on said terminal member, insulated tie members rigidly connecting together the upper and lower fin members, said intermediate fin member being shaped to clear the tie members, and terminal means on the upper and lower fin members.

4. A rectifier assembly comprising a lower fin member, an intermediate fin member, said intermediate fin member having a generally cup-shaped depression therein and being attached to the lower fin member, a semiconductor rectifier device disposed in said depression and conductively attached to the intermediate fin member, said rectifier device having an upper terminal member, an upper fin member mounted on said terminal member, said upper fin member having transverse ridges therein to provide flexibility, insulated tie members rigidly connecting together the upper and lower fin members, said intermediate fin member being shaped to clear the tie members, and terminal means on the upper and lower fin members, and mounting means on one of said upper and lower fin members.

5. A rectifier assembly comprising a generally cup-shaped metal container, a semiconductor rectifier cell disposed in said container and having one side attached to the container, a flexible conductor attached to the other side of the rectifier cell, a substantially rigid terminal member attached to the flexible conductor and extending outside the container, insulating sealing means closing the container, an intermediate fin member having a depression therein, said cup-shaped container being disposed in the depression and attached to the intermediate fin member, a lower fin member attached to the lower side of said depression, an upper fin member mounted on said terminal member, means for rigidly connecting together the upper and lower fin members and for insulating them from each other, and terminal means on the upper and lower fin members.

6. A rectifier assembly comprising a generally cup-shaped metal container, a semiconductor rectifier cell disposed in said container and having one side attached to the container, a flexible conductor attached to the other side of the rectifier cell, a substantially rigid terminal member attached to the flexible conductor and extending outside the container, insulating sealing means closing the container, an intermediate fin member having a depression therein, said cup-shaped container being disposed in the depression and attached to the intermediate fin member, a lower fin member attached to the lower side of said depression, an upper fin member mounted on said terminal member, said upper fin member having ridges therein to provide flexibility, means for rigidly connecting together the upper and lower fin members and for insulating them from each other, terminal means on the upper and lower fin members, and mounting means on one of said upper and lower fin members.

7. A rectifier assembly comprising a generally cup-shaped metal container, a semiconductor rectifier cell disposed in said container and having one side attached to the container, a flexible conductor attached to the other side of the rectifier cell, a substantially rigid terminal member attached to the flexible conductor and extending outside the container, insulating sealing means closing the container, an intermediate fin member having a depression therein, said cup-shaped container being disposed in the depression and attached to the intermediate fin member, a lower fin member attached to the lower side of said depression, an upper fin member mounted on said terminal member, said upper fin member having transverse ridges therein to provide flexibility, insulated tie members rigidly connecting together the upper and lower fin members, said intermediate fin member being shaped to clear the tie members, and terminal means on the upper and lower fin members.

8. A rectifier assembly comprising a lower fin member, a plurality of intermediate fin members, said intermediate fin members having nesting depressions therein attached together and the lowermost intermediate fin member being attached to the lower fin member, a semiconductor rectifier device disposed in the depression of the uppermost intermediate fin member and conductively attached thereto, said rectifier device having an upper terminal member, an upper fin member mounted on said terminal member, means for rigidly connecting together the upper and lower fin members and for insulating them from each other, and terminal means on the upper and lower fin members.

9. A rectifier assembly comprising a lower fin member, a plurality of intermediate fin members, said intermediate fin members having nesting depressions therein attached together and the lowermost intermediate fin member being attached to the lower fin member, a semiconductor rectifier device disposed in the depression of the uppermost intermediate fin member and conductively attached thereto, said rectifier device having an upper terminal member, an upper fin member mounted on said terminal member, said upper fin member having transverse ridges therein to provide flexibility, insulated tie members rigidly connecting together the upper and lower fin members, said intermediate fin member being shaped to clear the tie members, and terminal means on the upper and lower fin members.

References Cited in the file of this patent

UNITED STATES PATENTS

| | | |
|---|---|---|
| 2,744,218 | Burton et al. | May 1, 1956 |
| 2,745,044 | Lingel | May 8, 1956 |
| 2,751,528 | Burton | June 19, 1956 |
| 2,752,541 | Losco | June 26, 1956 |
| 2,756,374 | Colleran et al. | July 24, 1956 |
| 2,759,133 | Mueller | Aug. 14, 1956 |